(12) United States Patent
Pattee et al.

(10) Patent No.: US 9,074,860 B2
(45) Date of Patent: Jul. 7, 2015

(54) SYSTEMS AND METHODS FOR MAGNETOSTRICTIVE SENSING

(71) Applicant: Ametek, Horsham, PA (US)

(72) Inventors: Jack Pattee, Davisburg, MI (US); Mikhail Serafimovich Zhukov, Rochester Hills, MI (US)

(73) Assignee: Ametek, Horsham, PA (US)

( * ) Notice: Subject to any disclaimer, the term of this patent is extended or adjusted under 35 U.S.C. 154(b) by 266 days.

(21) Appl. No.: 13/799,381

(22) Filed: Mar. 13, 2013

(65) Prior Publication Data

US 2014/0266161 A1  Sep. 18, 2014

(51) Int. Cl.
*G01B 7/00* (2006.01)
*G01D 5/48* (2006.01)
*G01R 33/18* (2006.01)
*G01F 23/296* (2006.01)
*G01B 7/30* (2006.01)

(52) U.S. Cl.
CPC ............... *G01B 7/003* (2013.01); *G01D 5/485* (2013.01); *G01R 33/18* (2013.01); *G01F 23/2963* (2013.01); *G01B 7/30* (2013.01)

(58) Field of Classification Search
CPC .... G01D 5/485; G01F 23/2963; G01R 33/18; G01B 7/30; G01B 7/003
See application file for complete search history.

(56) References Cited

U.S. PATENT DOCUMENTS

| | | |
|---|---|---|
| 2,499,110 A | 2/1950 | Rich |
| 2,789,008 A | 4/1957 | Cronin |
| 2,803,808 A | 8/1957 | Wallace |
| 2,814,742 A | 11/1957 | Tognola |
| 3,154,946 A | 11/1964 | Ordorica et al. |
| 3,329,408 A | 7/1967 | Branson |
| 3,459,126 A | 8/1969 | Nyman |
| 3,505,576 A | 4/1970 | Burkhart |
| 3,774,134 A | 11/1973 | Kardashian et al. |
| 3,927,386 A | 12/1975 | Garshelis |
| 3,959,751 A | 5/1976 | Garshelis |
| 4,015,477 A | 4/1977 | Sitkewich |
| 4,028,619 A | 6/1977 | Edwards |
| 4,121,155 A | 10/1978 | Chamuel |

(Continued)

FOREIGN PATENT DOCUMENTS

| | | |
|---|---|---|
| CN | 101178061 A | 5/2008 |
| CN | 201322600 Y | 10/2009 |

(Continued)

*Primary Examiner* — Huy Q Phan
*Assistant Examiner* — Adam Clarke
(74) *Attorney, Agent, or Firm* — RatnerPrestia

(57) ABSTRACT

Magnetostrictive sensing systems and methods are disclosed. One such system comprises a magnetostrictive wire having first and second ends. A magnet is movable along a length of the magnetostrictive wire. An excitation device is operable to apply an electrical excitation signal to the magnetostrictive wire. A torsional motion sensor is operable to detect a torsional motion of the magnetostrictive wire. A reflective termination is configured to reflect the torsional motion of the magnetostrictive wire. A processor is in communication with the excitation device and the torsional motion sensor. The processor is programmed to (i) apply the electrical excitation signal to the magnetostrictive wire with the excitation device, (ii) identify whether the torsional motion detected by the torsional motion sensor has been reflected by the reflection termination, and (iii) calculate a position of the magnet along the magnetostrictive wire based on only the detected torsional motion reflected by the reflection termination.

28 Claims, 4 Drawing Sheets

100

(56) References Cited

U.S. PATENT DOCUMENTS

| | | | |
|---|---|---|---|
| 4,144,574 A | 3/1979 | Chamuel | |
| 4,319,189 A | 3/1982 | Cullum, Jr. et al. | |
| 4,404,523 A | 9/1983 | Hughes et al. | |
| 4,609,059 A | 9/1986 | Pasterkamp | |
| 5,017,867 A | 5/1991 | Dumais et al. | |
| 5,115,195 A | 5/1992 | Peterson et al. | |
| 5,150,049 A | 9/1992 | Schuetz | |
| 5,196,791 A * | 3/1993 | Dumais | 324/207.13 |
| 5,313,160 A | 5/1994 | Gloden et al. | |
| 5,320,325 A | 6/1994 | Young et al. | |
| 5,321,985 A | 6/1994 | Kashiwagi et al. | |
| 5,406,200 A * | 4/1995 | Begin et al. | 324/207.12 |
| 5,535,625 A * | 7/1996 | Levy | 73/290 V |
| 5,545,984 A | 8/1996 | Gloden et al. | |
| 5,590,091 A | 12/1996 | Gloden et al. | |
| 5,640,880 A | 6/1997 | Mulrooney et al. | |
| 5,672,812 A | 9/1997 | Meyer | |
| 5,684,459 A | 11/1997 | Liu et al. | |
| 5,694,097 A | 12/1997 | Nilsson | |
| 5,736,855 A | 4/1998 | Smith et al. | |
| 5,821,743 A | 10/1998 | Page, Jr. et al. | |
| 5,831,180 A | 11/1998 | Tanaka et al. | |
| 5,929,763 A | 7/1999 | Koski | |
| 6,192,096 B1 * | 2/2001 | Ichikawa et al. | 376/258 |
| 6,208,133 B1 | 3/2001 | Ehling et al. | |
| 6,212,944 B1 | 4/2001 | Kwun et al. | |
| 6,232,769 B1 | 5/2001 | Brunsch et al. | |
| 6,250,612 B1 | 6/2001 | Doll | |
| 6,351,117 B1 * | 2/2002 | Ehling | 324/207.13 |
| 6,441,608 B2 | 8/2002 | Brunsch et al. | |
| 6,456,064 B1 | 9/2002 | Dore et al. | |
| 6,509,733 B2 | 1/2003 | Blubaugh et al. | |
| 6,559,636 B1 | 5/2003 | Brunsch et al. | |
| 6,590,387 B2 | 7/2003 | Miller | |
| 6,612,168 B2 | 9/2003 | Barr et al. | |
| 6,707,290 B2 | 3/2004 | Nyce et al. | |
| 6,795,291 B2 | 9/2004 | Miller | |
| 6,840,200 B2 | 1/2005 | Miller | |
| 6,903,544 B2 | 6/2005 | Kurz et al. | |
| 6,919,779 B2 | 7/2005 | Raphalovitz et al. | |
| 6,974,115 B2 | 12/2005 | Silva | |
| 7,023,199 B2 | 4/2006 | Blubaugh et al. | |
| 7,059,238 B2 | 6/2006 | Albright et al. | |
| 7,121,185 B2 | 10/2006 | Alrefai | |
| 7,205,759 B2 | 4/2007 | Schroeder et al. | |
| 7,318,352 B2 | 1/2008 | Mohri et al. | |
| 7,345,472 B2 | 3/2008 | Barr et al. | |
| 7,466,124 B2 | 12/2008 | Janitch et al. | |
| 7,493,847 B2 | 2/2009 | Yajima et al. | |
| 7,520,183 B2 | 4/2009 | Kouduki et al. | |
| 7,715,167 B2 | 5/2010 | Edel et al. | |
| 7,737,684 B2 | 6/2010 | Barr et al. | |
| 7,855,551 B2 | 12/2010 | Steinich | |
| 7,874,801 B2 | 1/2011 | Schmidt | |
| 8,035,372 B2 | 10/2011 | Garneyer et al. | |
| 8,044,657 B2 | 10/2011 | Barr et al. | |
| 2005/0007099 A1 | 1/2005 | Hamasagar et al. | |
| 2008/0282812 A1 | 11/2008 | Schroeder et al. | |
| 2010/0097050 A1 | 4/2010 | Wangler et al. | |
| 2010/0170338 A1 * | 7/2010 | Prinstil et al. | 73/440 |

FOREIGN PATENT DOCUMENTS

| | | |
|---|---|---|
| CN | 201407228 Y | 2/2010 |
| CN | 201517578 U | 6/2010 |
| CN | 201687798 U | 12/2010 |
| CN | 102011763 A | 4/2011 |
| CN | 102322877 A | 1/2012 |
| DE | 19510250 C1 | 5/1996 |
| DE | 202006012815 U1 | 1/2008 |
| JP | 02-053592 | 2/1990 |

* cited by examiner

SYSTEMS AND METHODS FOR MAGNETOSTRICTIVE SENSING

FIELD OF THE INVENTION

This invention relates generally to sensing, and more particularly, to magnetostrictive sensing systems and methods.

BACKGROUND OF THE INVENTION

In numerous applications such as liquid level sensing or hydraulics, it may be desirable to measure linear displacement of an object. One conventional device for measuring linear displacement is a magnetostrictive sensor. Magnetostrictive sensors generally employ a magnetostrictive wire which runs in a straight line or curved path through a measurement area. In conjunction with this wire, the object to be measured may be provided with a magnet, which induces a torsional strain in the magnetostrictive wire when the wire is subject to an electrical signal. The position of the magnet represents the position of the monitored object, and is determined as a function of the time required for the torsional motion of the magnetostrictive wire to propagate from the area of influence of the magnet to a sensing apparatus located at one end of the wire. Alternatively, a torsional excitation signal may be imparted to the wire. When the torsional excitation signal passes the magnet, the magnet induces an electrical signal in the wire, which may be detected to determine the position of the magnet. Exemplary magnetostrictive sensors for use in linear displacement detection applications is disclosed in U.S. Pat. No. 5,017,867 to Dumais et al., the contents of which are incorporated by reference herein.

Magnetostrictive sensors may suffer from a number of problems in linear displacement sensing applications. As an example, when the monitored object is positioned too close to the end of the wire at which the sensing apparatus is positioned, the resulting torsional motion may be difficult to accurately detect, resulting in inaccurate sensing of linear displacement. Thus, improvements in such sensors are desired.

SUMMARY OF THE INVENTION

Aspects of the present invention are related to systems and methods for magnetostrictive sensing.

In accordance with one aspect of the present invention, a system for magnetostrictive sensing is disclosed. The system comprises a magnetostrictive wire, a magnet, an excitation device, a torsional motion sensor, a reflective termination, and a processor. The magnetostrictive wire has a first end and a second end. The magnet is disposed adjacent a portion of the magnetostrictive wire. The magnet is movable along a length of the magnetostrictive wire. The excitation device is coupled to the first end of the magnetostrictive wire. The excitation device is operable to apply an electrical excitation signal to the magnetostrictive wire. The torsional motion sensor is positioned adjacent the first end of the magnetostrictive wire. The torsional motion sensor is operable to detect a torsional motion of the magnetostrictive wire. The reflective termination is coupled to the second end of the magnetostrictive wire. The reflective termination is configured to reflect the torsional motion of the magnetostrictive wire. The processor is in communication with the excitation device and the torsional motion sensor. The processor is programmed to (i) apply the electrical excitation signal to the magnetostrictive wire with the excitation device, (ii) identify whether the torsional motion detected by the torsional motion sensor has been reflected by the reflection termination, and (iii) calculate a position of the magnet along the magnetostrictive wire based on only the detected torsional motion reflected by the reflection termination.

In accordance with another aspect of the present invention, a method for magnetostrictive sensing is disclosed. The method comprises applying an electrical excitation signal to a magnetostrictive wire with an excitation device coupled to a first end of the magnetostrictive wire, detecting a torsional motion of the magnetostrictive wire with a torsional motion sensor positioned adjacent the first end of the magnetostrictive wire, identifying whether the torsional motion detected by the torsional motion sensor has been reflected by a reflection termination coupled to a second end of the magnetostrictive wire, and calculating a position of a magnet along the magnetostrictive wire based on only the torsional motion reflected by the reflection termination.

In accordance with yet another aspect of the present invention, another system for magnetostrictive sensing is disclosed. The system comprises a magnetostrictive wire, a magnet, an excitation device, an electrical sensor, a reflective termination, and a processor. The magnetostrictive wire has a first end and a second end. The magnet is disposed adjacent a portion of the magnetostrictive wire. The magnet is movable along a length of the magnetostrictive wire. The excitation device is positioned adjacent the first end of the magnetostrictive wire. The excitation device is operable to apply a torsional excitation signal to the magnetostrictive wire. The electrical sensor is electrically coupled to the magnetostrictive wire. The electrical sensor is operable to detect an electrical pulse propagating along the magnetostrictive wire. The reflective termination is coupled to the second end of the magnetostrictive wire. The reflective termination is configured to reflect the torsional excitation signal propagating along the magnetostrictive wire. The processor is in communication with the excitation device and the electrical sensor. The processor is programmed to (i) apply the torsional excitation signal to the magnetostrictive wire with the excitation device, (ii) identify whether the electrical pulse detected by the electrical sensor was generated by the torsional excitation signal after the torsional excitation signal was reflected by the reflection termination, and (iii) calculate a position of the magnet along the magnetostrictive wire based on only the detected electrical pulse generated by the torsional excitation signal after the torsional excitation signal was reflected by the reflection termination.

In accordance with still another aspect of the present invention, another method for magnetostrictive sensing is disclosed. The method comprises applying a torsional excitation signal to a magnetostrictive wire with an excitation device positioned adjacent a first end of the magnetostrictive wire, detecting an electrical pulse propagating along the magnetostrictive wire with an electrical sensor electrically coupled to the first end of the magnetostrictive wire, identifying whether the electrical pulse detected by the electrical sensor was generated by the torsional excitation signal after the torsional excitation signal was reflected by a reflection termination coupled to a second end of the magnetostrictive wire, and calculating a position of a magnet along the magnetostrictive wire based on only the detected electrical pulse generated by the torsional excitation signal after the torsional excitation signal was reflected by the reflection termination.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be dropped. According to common practice, the various features of the drawings are not drawn to scale unless otherwise indicated. To the contrary, the dimensions of the various features may be expanded or reduced for clarity. Included in the drawings are the following figures.

DETAILED DESCRIPTION OF THE INVENTION

Aspects of the present invention are directed to magnetostrictive sensing systems that employ improved algorithms for linear displacement detection. In particular, the disclosed embodiments detect linear displacement using only a reflected signal propagating along the magnetostrictive wire.

The disclosed embodiments are particularly suitable for use in applications where "ringing" occurs during conventional position detection. "Ringing" refers to a situation in which the wire excitation signal penetrates the torsional motion sensor signal either directly and/or indirectly due to the effect of the magnet on the magnetostrictive wire, thereby interfering with the detection of the torsional signal from the magnetostrictive wire. When the magnet is close to the sensing end (in FIG. 1) or the transmitting end (in FIG. 2) of the magnetostrictive wire, the wire excitation signal penetration and the magnet's effect on the magnetostrictive wire in response to the electrical or mechanical excitation signal may cause a feedback or "ringing" in the detected signal, and thereby interfere with the precise detection of the magnet's position. The systems and methods disclosed herein advantageously enable precise linear displacement detection by avoidance of this "ringing" signal, even in situations where the magnet is close to the sensing end or the transmitting end of the magnetostrictive wire.

Figure 1:
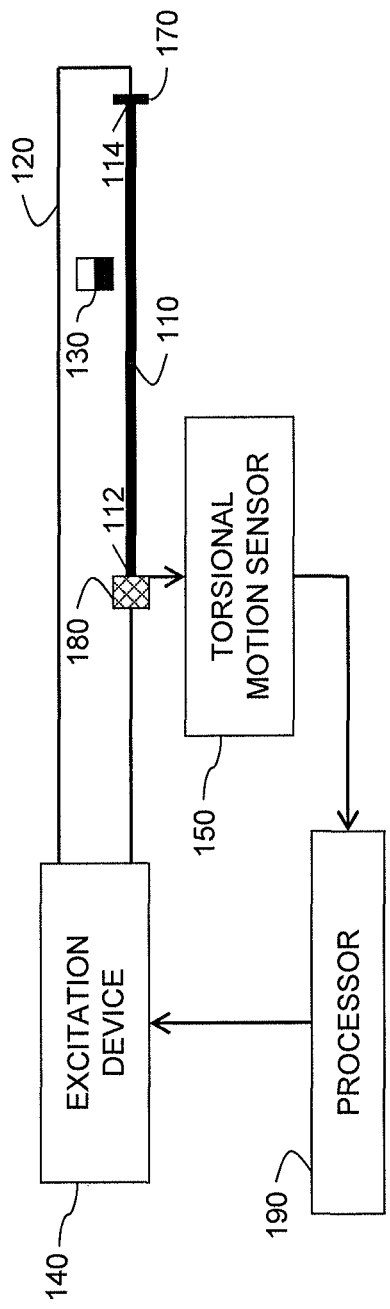
FIG. 1 is a diagram illustrating an exemplary system for magnetostrictive sensing in accordance with aspects of the present invention.

FIG. 1 illustrates an exemplary system 100 for magnetostrictive sensing in accordance with aspects of the present invention. As a general overview, system 100 includes a magnetostrictive wire 110, a magnet 130, excitation device 140, a torsional motion sensor 150, a reflective termination 170, and a processor 190. Additional details of system 100 are described below.

Magnetostrictive wire 110 propagates a signal for detecting a position of the sensed object. Magnetostrictive wire 110 has a first end 112 and a second end 114, which are fixed in place within system 100 (e.g., by being fixed to a housing of system 100). In an exemplary embodiment, magnetostrictive wire 110 extends in a substantially straight line between ends 112 and 114, as shown in FIG. 1. However, magnetostrictive wire 110 may extend in a curved path between ends 112 and 114. Suitable materials for use as magnetostrictive wire 110 include, for example, cobalt, nickel, or iron alloys.

System 100 may also include a return wire 120. Return wire 120 is electrically connected to end 114 of magnetostrictive wire 110. As will be discussed herein, return wire 120 is connected in series with magnetostrictive wire 110, and enables transmission of the electrical excitation signal through magnetostrictive wire 110 to ground (or back to excitation device 140).

Magnet 130 is disposed adjacent a portion of magnetostrictive wire 110, such that magnet 130 is movable along a length of magnetostrictive wire 110. In particular, magnet 130 corresponds to the position of the object to be sensed by system 100. In other words, system 100 is configured to detect the position (or linear displacement) or magnet 130. Magnet 130 may be fixed coupled to, embedded within, or integrally formed with the sensed object. In an exemplary embodiment, magnet 130 is a circular magnet, and is arranged annularly surrounding magnetostrictive wire 110. Suitable materials for use as magnet 130 will be known to one of ordinary skill in the art from the description herein.

Excitation device 140 is coupled to end 112 of magnetostrictive wire 110. Excitation device 140 is operable to apply an electrical excitation signal to magnetostrictive wire 110. In an exemplary embodiment, excitation device 140 comprises a pulse generating circuit. In this embodiment, the electrical excitation signal is an electrical pulse. The electrical pulse may have a precisely predetermined duration, e.g., 2 μs, and/or amplitude, e.g. two amperes. Excitation device 140 generates the electrical pulse and then applies the electrical pulse to magnetostrictive wire 110, e.g. via two or more electrical connections. Suitable pulse generating circuits for use as excitation device 140 will be known to one of ordinary skill in the art from the description herein.

Torsional motion sensor 150 is positioned adjacent end 112 of magnetostrictive wire 110. Torsional motion sensor 150 is operable to detect a torsional motion of magnetostrictive wire 110, i.e., a rotation of a portion of magnetostrictive wire 110 about its axis. In an exemplary embodiment, torsional motion sensor 150 is a piezoelectric transducer. The transducer includes a layer of piezoelectric material in contact with magnetostrictive wire 110. When a propagating torsional motion of magnetostrictive wire 110 arrives at the transducer, the portion of piezoelectric material in contact with magnetostrictive wire 110 experiences a strain, which induces a voltage across the face of the layer of piezoelectric material. This voltage may be sensed with signal wires of torsional motion sensor, and converted to an electrical signal for processing. The electrical signal is thus indicative of detection of torsional strain in magnetostrictive wire 110. Suitable transducers for use as torsional motion sensor 150 include the piezo-film sensors provided by Measurement Specialties Co. of Hampton, Va., USA. Other suitable transducers include sensors operable to detect mechanical displacement, force, or the magnetic field associated with the torsional motion.

Reflective termination 170 is coupled to end 114 of magnetostrictive wire 110. Reflective termination 170 fixes end 114 to the housing of system 100, as shown in FIG. 1. Reflective termination 170 is configured to reflect torsional motion propagating along magnetostrictive wire 110. In an exemplary embodiment, reflection termination 170 comprises a solid collar sized to completely surround an outer surface of magnetostrictive wire 110. The collar is desirably formed of non-magnetic material (e.g. nonmagnetic metal such as aluminum or brass), and is fixedly coupled to magnetostrictive wire 110 (e.g., via one or more screws, soldering, or welding). By rigidly mounting magnetostrictive wire 110 to reflective termination 170, it can be assured that torsional movements propagating toward end 114 of magnetostrictive wire 110 will be substantially entirely reflected.

System 100 may also include a damping termination 180. Damping termination 180 fixes end 112 to the housing of system 100, as shown in FIG. 1. Damping termination 180 is configured to substantially prevent the reflection of any torsional motion propagating along magnetostrictive wire 110. In an exemplary embodiment, damping termination comprises one or more pieces of compressible material (e.g. rubber) surrounding an outer surface of magnetostrictive wire 110. In a further embodiment, the one or more pieces of compressible material may be positioned around the outside of end 112 and torsional motion sensor 150, to maintain the connection between the two components while preventing reflection of torsional movements.

Processor 190 controls the operation of system 100. Processor 190 may include multiple integrated circuits, gates, and electrical interconnects for transmitting, receiving, and processing signals within system 100. In particular, processor 190 is in communication with excitation device 140 and torsional motion sensor 150. Suitable components that may be adapted for use as processor 190 include, for example, conventional microcontrollers, logic IC, operational amplifiers, transistors, diodes, capacitors, resistors, and other electronic components.

An operation of system 100 will now be described in accordance with aspects of the present invention. The following operation describes the determination of position (or linear displacement) of magnet 130 along magnetostrictive wire 110 using system 100.

System 100 may receive an external signal requesting the detection of position of magnet 130, or it may be programmed to periodically detect the position of magnet 130. When such a detection is to take place, processor 190 controls excitation device 140 to apply an electrical excitation signal to end 112 of magnetostrictive wire 110. As set forth above, the electrical excitation signal may take the form of an electrical pulse having a predetermined amplitude and/or duration.

When the electrical excitation signal is applied to end 112, it will propagate outward through magnetostrictive wire 110. The speed at which the electrical excitation signal propagates through magnetostrictive wire 110 may be predetermined based the materials and dimensions of magnetostrictive wire 110.

When the electrical excitation signal passes magnet 130, a localized torsional strain is imparted to magnetostrictive wire 110 by the interaction of the electrical excitation signal with the magnetic field of magnet 130—this torsional strain is the result of "magnetostriction" or the "magnetostrictive effect". The degree of torsional strain is dependent on the material of wire 110, which affects the strength of the magnetostrictive effect. After passing the magnet 130, the electrical excitation signal is transmitted from magnetostrictive wire 110 to return wire 120, and may then be dissipated to ground.

The torsional strain imparted by the magnetostrictive effect results in a torsional motion in magnetostrictive wire 110, which propagates away from magnet 130. This torsional motion propagates in both directions along the wire, i.e., toward both ends 112 and 114 of magnetostrictive wire 110. Like the electrical excitation signal, the speed at which the torsional motion propagates through magnetostrictive wire 110 may be predetermined based the materials and dimensions of magnetostrictive wire 110.

The torsional motion propagating toward end 112 is received by torsional motion sensor 150. The torsional motion propagating toward end 114 is reflected by reflection termination 170, after which it propagates through the entire length of magnetostrictive wire 110 before being likewise received by torsional motion sensor 150. Processor 190 then receives corresponding electrical signals from torsional motion sensor 150 representative of the torsional motion detected by sensor 150, and identifies whether the torsional motion detected by torsional motion sensor 150 has been reflected by reflection termination 170. Processor 190 may identify the reflected torsional motion by a number of different methods.

For one example, processor 190 identifies whether torsional motion detected by torsional motion sensor 150 has been reflected by reflection termination 170 based on a time duration between the application of the electrical excitation signal to magnetostrictive wire 110 and the detection of the corresponding torsional motion by torsional motion sensor 150. In this example, a time $t_L$ is required for torsional motion to traverse the entire length of magnetostrictive wire 110. This time $t_L$ may be predetermined (since the speed of propagation of the torsional motion may be predetermined, as described above). Additionally, in this example it may be presumed that the time for propagation of the electrical excitation signal from end 112 to magnet 130 is negligible relative to $t_L$ (i.e., that the torsional motion begins propagating a negligible amount of time following application of the electrical excitation signal). Thus, it is known that the torsional motion reflected by reflection termination 170 cannot be received before $t_L$ has elapsed since the application of the electrical excitation signal. In other words, processor 190 identifies a particular torsional motion as being the reflected torsional motion if that motion is received in the time window beginning after $t_L$ since application of the electrical excitation signal, and ending before $2t_L$ since application of the electrical excitation signal.

For another example, processor 190 identifies whether torsional motion detected by torsional motion sensor 150 has been reflected by reflection termination 170 based on a number of torsional motions detected by torsional motion sensor 150. In this example, it is known that the torsional motion reflected by reflection termination 170 cannot be received by torsional motion sensor 150 prior to the torsional motion that propagates directly from magnet 130 to end 112. Thus, it is known that the reflection torsional motion will always be the second torsional motion received by torsional motion sensor 150 (presuming the use of only one magnet 130). In other words, processor 190 identifies the second torsional motion received by torsional motion sensor 150 following application of the electrical excitation signal as being the reflected torsional motion.

For still another example, processor 190 identifies whether torsional motion detected by torsional motion sensor 150 has been reflected by reflection termination 170 based on a direction of the torsional motion. In this example, it is known that the torsional motion propagating outward from magnet 130 comprises torsion in a single direction (i.e. clockwise or counterclockwise) relative to an axis of magnetostrictive wire 110. It is also known that when torsional motion is reflected at reflection termination 170, its direction will switch (e.g., clockwise torsional motion will become counter-clockwise). Thus, the torsional motion detected by torsional motion sensor 150 may be identified based on the direction of the torsional motion, which may be determined by the polarity of the signal from torsional motion sensor 150. In other words, processor 190 identifies a particular torsional motion as being the reflection torsional motion if that motion has a particular predetermined direction (i.e. clockwise or counterclockwise).

The above paragraphs illustrate exemplary methods for identifying whether torsional motion detected by torsional motion sensor 150 has been reflected by reflection termination 170 using processor 190. It will be understood that these methods are exemplary, and are not intended to be limiting; other methods for identifying whether the torsional motion has been reflected may be used without departing from the present invention.

Following the above identification, processor 190 calculates a position of magnet 130 along magnetostrictive wire 110. Processor 190 calculates this position using only the torsional motion identified as being reflected by the reflection termination. By using only the reflected torsional motion, processor 190 desirably avoids the inaccuracies that may be present in the non-reflected torsional motion, i.e. due to the "ringing" effect described above. Thus, this embodiment is unlike conventional techniques, which look at the non-reflected torsional motion (either with or without the reflected torsional motion), and which therefore are susceptible to "ringing." Since torsional motion excitation to torsional motion detection time is large and equal to torsional motion traverse time through an entire length of the magnetostrictive wire, it is easy to cut off "ringing" noise with slow inexpensive electronic means. Processor 190 may calculate the position using only the reflected torsional motion by a number of different methods.

For one example, processor 190 calculates the position of magnet 130 based on a time duration between the application of the electrical excitation signal to magnetostrictive wire 110 and the detection of the reflected torsional motion by torsional motion sensor 150. This example is similar to the method described above for identifying the reflected torsional motion. In this example, the speed of propagation of the electrical excitation signal ($R_e$) and the torsional motion ($R_m$) are predetermined (as described above, based on the materials and dimensions of magnetostrictive wire 110). Based on these predetermined values, the following equation gives the time duration between the application of the electrical excitation signal to magnetostrictive wire 110 and the detection of the reflected torsional motion by torsional motion sensor 150:

$$t_1 = \frac{D}{R_e} + \frac{(2L-D)}{R_m} + \Delta t$$

where $t_1$ is the time duration, D is the distance of the magnet 130 from torsional motion detector 150, L is the length of magnetostrictive wire 110 from torsional motion detector 150 to reflection termination 170, and $\Delta t$ is an inherent delay time in the electronics of system 100 (which may be predetermined and/or accounted for by processor 190 by testing system 100 with magnet 130 in a known position). From this equation, the distance D of magnet 130 from torsional motion detector 150 (i.e., the position of magnet 130 along magnetostrictive wire 110) may be solved for:

$$D = \frac{R_e R_m}{(R_e - R_m)}\left[\Delta t + \frac{2L}{R_m} - t_1\right]$$

Thus, once $t_1$ is determined by processor 190, the precise value of D may be calculated.

Figure 2:
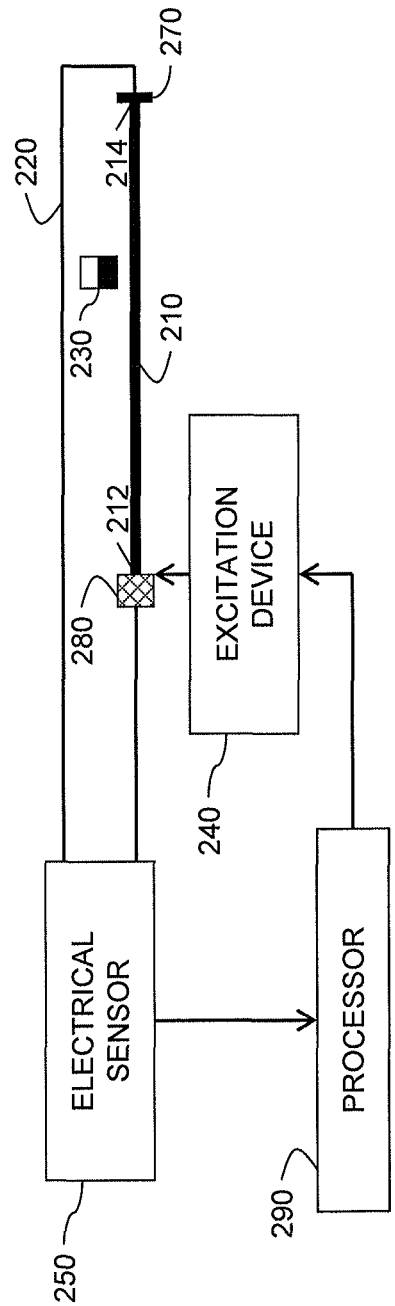
FIG. 2 is a diagram illustrating another exemplary system for magnetostrictive sensing in accordance with aspects of the present invention.

FIG. 2 illustrates another exemplary system 200 for magnetostrictive sensing in accordance with aspects of the present invention. As a general overview, system 200 includes a magnetostrictive wire 210, a magnet 230, excitation device 240, an electrical sensor 250, a reflective termination 270, and a processor 290. Additional details of system 200 are described below.

Magnetostrictive wire 210 propagates a signal for detecting a position of the sensed object. Magnetostrictive wire 210 has a first end 212 and a second end 214, which are fixed in place within system 200 (e.g., by being fixed to a housing of system 100). Magnetostrictive wire 210 may be a wire substantially as described above with respect to magnetostrictive wire 110.

System 200 may also include a return wire 220. Return wire 220 is electrically connected to end 214 of magnetostrictive wire 210. As will be discussed herein, return wire 220 is connected in series with magnetostrictive wire 210, and enables reception of an electrical pulse through magnetostrictive wire 210 to ground (or back to electrical sensor 250).

Magnet 230 is disposed adjacent a portion of magnetostrictive wire 210, such that magnet 230 is movable along a length of magnetostrictive wire 210. Magnet 230 may be a magnet substantially as described above with respect to magnet 130.

Excitation device 240 is positioned adjacent end 212 of magnetostrictive wire 210. Excitation device 240 is operable to apply a torsional excitation signal to magnetostrictive wire 210. In an exemplary embodiment, excitation device 240 comprises a transducer mechanically connected to the magnetostrictive wire 210. In this embodiment, the torsional excitation signal is a torsional strain imparted to the wire by the transducer. Suitable transducers for use as excitation device 240 will be known to one of ordinary skill in the art from the description herein.

Electrical sensor 250 is coupled to either end 212 or 214 of magnetostrictive wire 210. Electrical sensor 250 is operable to detect an electrical signal in magnetostrictive wire 210, i.e., an electrical pulse propagating through magnetostrictive wire 210. In an exemplary embodiment, electrical sensor 250 is a voltage detector. Suitable voltage detectors for use as electrical sensor 250 include any electrical circuits (e.g., transformers, operational amplifiers, comparators) that convert electrical potential difference between end 212 and 214 of magnetostrictive wire 210 to a suitable signal for processor 290. Other suitable detectors will be known to one of ordinary skill in the art from the description herein.

Reflective termination 270 is coupled to end 214 of magnetostrictive wire 210. Reflective termination 270 fixes end 214 to the housing of system 200, as shown in FIG. 2. Reflective termination 270 is configured to reflect torsional motion propagating along magnetostrictive wire 210. Reflective termination 270 may be a termination substantially as described above with respect to reflective termination 170.

System 200 may also include a damping termination 280. Damping termination 280 fixes end 212 to the housing of system 200, as shown in FIG. 2. Damping termination 280 is configured to substantially prevent the reflection of any torsional motion propagating along magnetostrictive wire 210. Damping termination 280 may be a termination substantially as described above with respect to damping termination 180.

Processor 290 controls the operation of system 200. In particular, processor 290 is in communication with excitation device 240 and electrical sensor 250. Processor 290 may include any of the components described above with respect to processor 190.

An operation of system 200 will now be described in accordance with aspects of the present invention. The following operation describes the determination of position (or linear displacement) of magnet 230 along magnetostrictive wire 210 using system 200.

System 200 may receive an external signal requesting the detection of position of magnet 230, or it may be programmed to periodically detect the position of magnet 230. When such a detection is to take place, processor 290 controls excitation device 240 to apply a torsional excitation signal to end 212 of magnetostrictive wire 210. As set forth above, the torsional excitation signal may take the form of a torsional strain imparted to the wire by the transducer.

When the torsional excitation signal is applied to end 212, it will propagate outward through magnetostrictive wire 210. The speed at which the torsional excitation signal propagates through magnetostrictive wire 210 may be predetermined based the materials and dimensions of magnetostrictive wire 210.

When the torsional excitation signal passes magnet 230, an electrical pulse is generated in the magnetostrictive wire 210 by the interaction of the torsion of magnetostrictive wire 210 with the magnetic field of magnet 230—this electrical pulse is also the result of "magnetostriction" or the "magnetostrictive effect". The amplitude of the electrical pulse is dependent on the material of wire 210, which affects the strength of the magnetostrictive effect.

After passing the magnet 230, the torsional excitation signal is propagates to fixed end 214 of magnetostrictive wire 210. The torsional excitation signal propagating toward end 214 is reflected by reflection termination 270, after which it propagates back along magnetostrictive wire and past magnet 230. When the torsional excitation signal passes magnet 230 again, it generates another electrical pulse in magnetostrictive wire 210 (in the same manner described above).

The electrical pulses generated in magnetostrictive wire 210 propagate away from magnet 230. These electrical pulses propagate in both directions along the wire, i.e., toward both ends 212 and 214 of magnetostrictive wire 210. Like the torsional excitation signal, the speed at which the electrical pulse propagates through magnetostrictive wire 210 may be predetermined based the materials and dimensions of magnetostrictive wire 210. The electrical pulses may be transmitted to electrical sensor 250 either directly from end 212 of magnetostrictive wire 210, or via return wire 220 from end 214.

The electrical pulse generated by the torsional excitation signal on its first pass is received first by electrical sensor 250. Electrical sensor 250 then receives the electrical pulse generated by the torsional excitation signal reflected by reflection termination 270. Processor 290 then receives corresponding electrical signals from electrical sensor 250 representative of the electrical pulses detected by sensor 250, and identifies whether the electrical pulse detected by electrical sensor 250 was generated by the torsional excitation signal reflected by reflection termination 270. Processor 290 may identify whether the electrical pulse was generated by the reflected torsional excitation signal by a number of different methods.

For one example, processor 290 identifies whether an electrical pulse detected by electrical sensor 250 was generated by the reflected torsional excitation signal based on a time duration between the application of the torsional excitation signal to magnetostrictive wire 210 and the detection of the corresponding electrical pulse by electrical sensor 250. In this example, a time $t_L$ is required for torsional motion to traverse the entire length of magnetostrictive wire 210. This time $t_L$ may be predetermined (since the speed of propagation of the torsional motion may be predetermined, as described above). Additionally, in this example it may be presumed that the time for propagation of the electrical pulse from magnet 230 to electrical sensor 250 is negligible relative to $t_L$ (i.e., that the torsional motion begins propagating a negligible amount of time following application of the electrical excitation signal). Thus, it is known that the electrical pulse generated by the torsional excitation signal reflected by reflection termination 270 cannot be received before $t_L$ has elapsed since the application of the torsional excitation signal. In other words, processor 290 identifies a particular electrical pulse as generated by the reflected torsional excitation signal if that pulse is received in the time window beginning after $t_L$ since application of the torsional excitation signal, and ending before $2t_L$ since application of the torsional excitation signal.

For another example, processor 290 identifies whether electrical pulse detected by electrical sensor 250 was generated by the reflected torsional excitation signal based on a number of electrical pulses detected by electrical sensor 250. In this example, it is known that the electrical pulse generated by the reflected torsional excitation signal cannot be received by electrical sensor 250 prior to the electrical pulse generated by the torsional excitation signal that propagates directly from end 212 of magnetostrictive wire 210 to magnet 230. Thus, it is known that the electrical pulse generated by the reflected torsional excitation signal will always be the second electrical pulse received by electrical sensor 250 (presuming the use of only one magnet 230). In other words, processor 290 identifies the second electrical pulse received by electrical sensor 250 following application of the torsional excitation signal as being the electrical pulse generated by the reflected torsional excitation signal.

For still another example, processor 290 identifies whether an electrical pulse detected by electrical sensor 250 was generated by the reflected torsional excitation signal based on a polarity of the electrical pulse. In this example, it is known that the electrical pulse generated by the unreflected torsional excitation signal has a certain polarity (e.g. positive). It is also known that the electrical signal generated by the reflected torsional excitation signal will have an opposite polarity (e.g. negative). Thus, the electrical pulse detected by electrical sensor 250 may be identified based on the polarity of the electrical pulse.

The above paragraphs illustrate exemplary methods for identifying whether an electrical pulse detected by electrical sensor 250 was generated by the torsional excitation signal that was reflected by reflection termination 170. It will be understood that these methods are exemplary, and are not intended to be limiting; other methods for identifying whether the torsional motion has been reflected may be used without departing from the present invention.

Following the above identification, processor 290 calculates a position of magnet 130 along magnetostrictive wire 110. Processor 290 calculates this position using only the electrical pulse identified as being generated by the reflected torsional excitation signal. By using only the electrical pulse generated by the reflected torsional excitation sensor, processor 290 desirably avoids the inaccuracies that may be present in the non-reflected torsional motion, i.e. due to the "ringing" effect described above. Processor 290 may be configured to calculate the position of magnet 230 using substantially the same algorithms described above with respect to processor 190.

Figure 3:
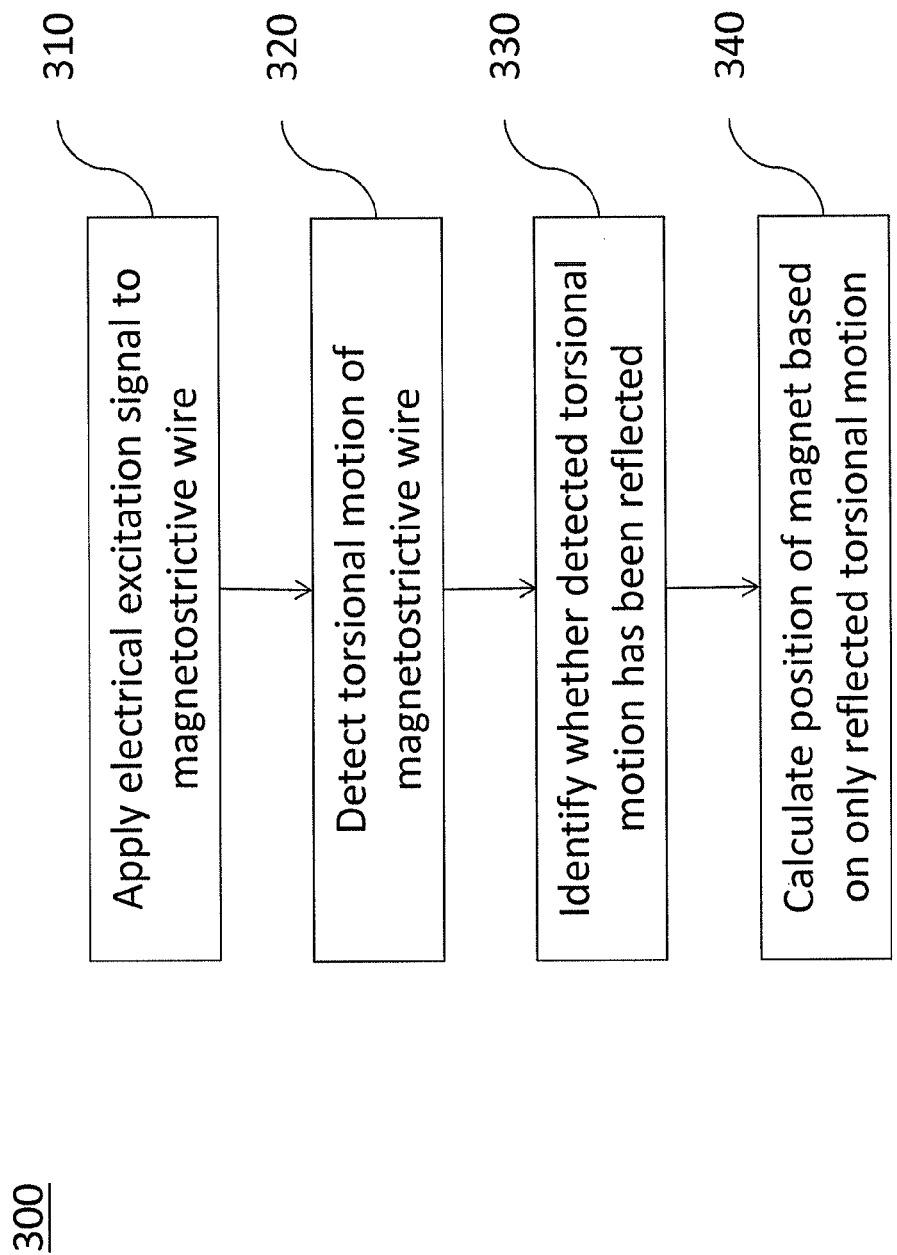
FIG. 3 is a flowchart illustrating an exemplary method for magnetostrictive sensing in accordance with aspects of the present invention.

FIG. 3 illustrates an exemplary method 300 for magnetostrictive sensing in accordance with aspects of the present invention. As a general overview, method 300 includes applying an electrical excitation signal, detecting torsional motion, identifying whether the torsional motion has been reflected, and calculating linear displacement. Additional details of method 300 are described below with respect to the components of system 100.

In step 310, an electrical excitation signal is applied to a magnetostrictive wire. In an exemplary embodiment, processor 190 controls excitation device 140 to apply an electrical excitation signal to end 112 of magnetostrictive wire 110. As set forth above, the electrical excitation signal may be an electrical pulse having a precisely predetermined duration and/or amplitude.

In step 320, a torsional motion of the magnetostrictive wire is detected. As set forth above, a torsional strain is imparted to magnetostrictive wire 110 when the electrical excitation signal passes magnet 130. The torsional strain imparted by the magnetostrictive effect results in a torsional motion in magnetostrictive wire 110, which propagates away from magnet 130. The torsional motion is detected with torsional motion sensor 150.

In step 330, it is identified whether the detected torsional motion has been reflected. In an exemplary embodiment, processor 190 identifies whether the torsional motion detected by torsional motion sensor 150 has been reflected by reflection termination 170 coupled to end 114 of magnetostrictive wire 110.

Processor 190 may identify the reflected torsional motion using any of the operating methods set forth above with respect to system 100, including: based on a time duration between the application of the electrical excitation signal to magnetostrictive wire 110 and the detection of the corresponding torsional motion by torsional motion sensor 150 (i.e. based on a time duration between steps 310 and 320); based on a number of torsional motions detected by torsional motion sensor 150; and/or based on a direction of the torsional motion.

In step 340, a position of the magnet is calculated. In an exemplary embodiment, processor 190 calculates the position of magnet 130 along magnetostrictive wire 110 based on only the torsional motion reflected by reflection termination 170. Processor 190 may calculate the position of magnet 130 using the equations set forth above with respect to system 100.

Figure 4:
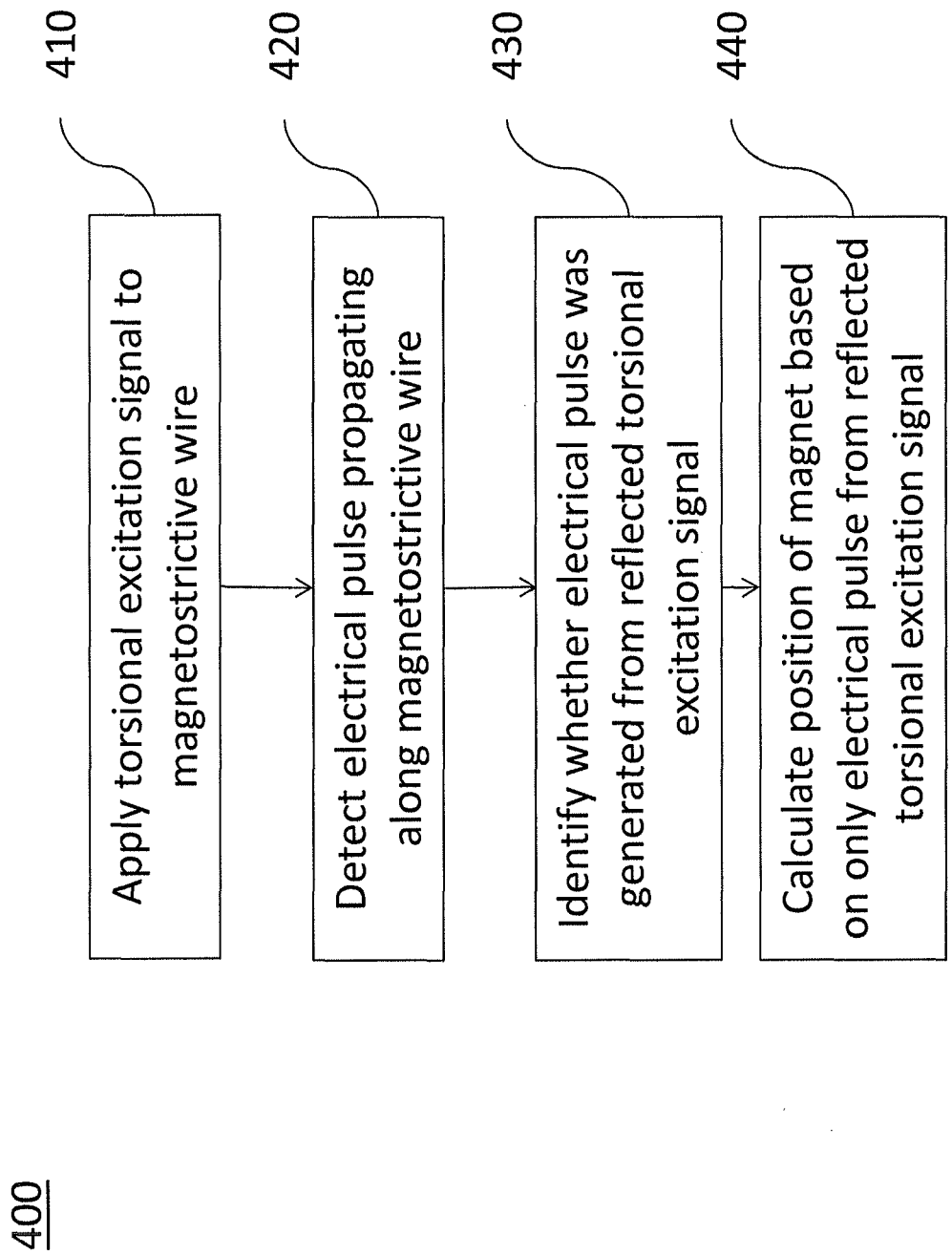
FIG. 4 is a flowchart illustrating another exemplary method for magnetostrictive sensing in accordance with aspects of the present invention.

FIG. 4 illustrates another exemplary method 400 for magnetostrictive sensing in accordance with aspects of the present invention. As a general overview, method 400 includes applying a torsional excitation signal, detecting an electrical pulse, identifying whether the electrical pulse was generated by a reflected torsional excitation signal, and calculating linear displacement. Additional details of method 400 are described below with respect to the components of system 200.

In step 410, a torsional excitation signal is applied to a magnetostrictive wire. In an exemplary embodiment, processor 290 controls excitation device 240 to apply a torsional excitation signal to end 212 of magnetostrictive wire 210. As set forth above, the torsional excitation signal may be a torsional strain applied to magnetostrictive wire 210.

In step 420, an electrical pulse propagating along the magnetostrictive wire is detected. As set forth above, an electrical pulse is generated in magnetostrictive wire 210 when the torsional excitation signal passes magnet 230. The electrical pulse propagates away from magnet 230. The electrical pulse is detected with electrical sensor 250.

In step 430, it is identified whether the detected electrical pulse was generated by the reflected torsional excitation signal. In an exemplary embodiment, processor 290 identifies whether the electrical pulse detected by electrical sensor 250 was generated by the torsional excitation signal that was reflected by reflection termination 270.

Processor 290 may identify the electrical pulse generated by the reflected torsional excitation signal using any of the operating methods set forth above with respect to system 200, including: based on a time duration between the application of the torsional excitation signal to magnetostrictive wire 210 and the detection of the corresponding electrical pulse by electrical sensor 250 (i.e. based on a time duration between steps 410 and 420); based on a number of electrical pulses detected by electrical sensor 250; and/or based on a polarity of the electrical pulse.

In step 440, a position of the magnet is calculated. In an exemplary embodiment, processor 290 calculates the position of magnet 230 along magnetostrictive wire 210 based on only the electrical pulse generated by the reflected torsional excitation signal. Processor 290 may calculate the position of magnet 230 using the equations set forth above with respect to system 100.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A system for magnetostrictive sensing comprising:
a magnetostrictive wire having a first end and a second end;
a magnet disposed adjacent a portion of the magnetostrictive wire, the magnet movable along a length of the magnetostrictive wire;
an excitation device coupled to the first end of the magnetostrictive wire, the excitation device operable to apply an electrical excitation signal to the magnetostrictive wire;
a torsional motion sensor positioned adjacent the first end of the magnetostrictive wire, the torsional motion sensor operable to detect a torsional motion of the magnetostrictive wire;
a reflective termination coupled to the second end of the magnetostrictive wire, the reflective termination configured to reflect the torsional motion of the magnetostrictive wire; and
a processor in communication with the excitation device and the torsional motion sensor, the processor programmed to (i) apply the electrical excitation signal to the magnetostrictive wire with the excitation device, (ii) identify whether the torsional motion detected by the torsional motion sensor has been reflected by the reflection termination, and (iii) calculate a position of the magnet along the magnetostrictive wire based on the detected torsional motion reflected by the reflection termination and without using any torsional motion that propagated directly from the magnet to the first end of the wire.

2. The system of claim 1, further comprising:
a return wire coupled to the second end of the magnetostrictive wire.

3. The system of claim 1, further comprising:
a damping termination coupled to the first end of the magnetostrictive wire, the damping termination configured to substantially prevent any reflection of the torsional motion of the magnetostrictive wire.

4. The system of claim 1, wherein the processor identifies whether torsional motion detected by the torsional motion sensor has been reflected by the reflection termination based on a time duration between the application of the excitation signal to the magnetostrictive wire and the detection of the torsional motion by the torsional motion sensor.

5. The system of claim 4, wherein the time duration is greater than a length of time required for the torsional motion to traverse an entire length of the magnetostrictive wire, and less than twice the length of time required for the torsional motion to traverse the entire length of the magnetostrictive wire.

6. The system of claim 1, wherein the processor identifies whether torsional motion detected by the torsional motion sensor has been reflected by the reflection termination based on a number of torsional motions detected by the torsional motion sensor.

7. The system of claim 6, wherein the processor identifies whether torsional motion detected by the torsional motion sensor has been reflected by the reflection termination if the torsional motion is a second torsional motion detected by the torsional motion sensor following the application of the excitation signal.

8. The system of claim 1, wherein the processor identifies whether torsional motion detected by the torsional motion sensor has been reflected by the reflection termination based on a direction of the torsional motion.

9. A method for magnetostrictive sensing comprising:
applying an electrical excitation signal to a magnetostrictive wire with an excitation device coupled to a first end of the magnetostrictive wire;
detecting a torsional motion of the magnetostrictive wire with a torsional motion sensor positioned adjacent the first end of the magnetostrictive wire;
identifying whether the torsional motion detected by the torsional motion sensor has been reflected by a reflection termination coupled to a second end of the magnetostrictive wire; and
calculating a position of a magnet along the magnetostrictive wire based on the torsional motion reflected by the reflection termination and without using any torsional motion that propagated directly from the magnet to the first end of the wire.

10. The method of claim 9, wherein the identification step is based on a time duration between the applying step and the detecting step.

11. The method of claim 10, wherein the time duration is greater than a length of time required for the torsional motion to traverse an entire length of the magnetostrictive wire, and less than twice the length of time required for the torsional motion to traverse the entire length of the magnetostrictive wire.

12. The method of claim 9, wherein the identification step is based on a number of torsional motions detected by the torsional motion sensor.

13. The method of claim 12, wherein the identifying step comprises identifying a second torsional motion detected by the torsional motion sensor as being the torsional motion that has been reflected by the reflection termination.

14. The method of claim 9, wherein the identification step is based on a direction of the torsional motion detected by the torsional motion sensor.

15. A system for magnetostrictive sensing comprising:
a magnetostrictive wire having a first end and a second end;
a magnet disposed adjacent a portion of the magnetostrictive wire, the magnet movable along a length of the magnetostrictive wire;
an excitation device positioned adjacent the first end of the magnetostrictive wire, the excitation device operable to apply a torsional excitation signal to the magnetostrictive wire;
an electrical sensor electrically coupled to the magnetostrictive wire, the electrical sensor operable to detect an electrical pulse propagating along the magnetostrictive wire;
a reflective termination coupled to the second end of the magnetostrictive wire, the reflective termination configured to reflect the torsional excitation signal propagating along the magnetostrictive wire; and
a processor in communication with the excitation device and the electrical sensor, the processor programmed to (i) apply the torsional excitation signal to the magnetostrictive wire with the excitation device, (ii) identify whether the electrical pulse detected by the electrical sensor was generated by the torsional excitation signal after the torsional excitation signal was reflected by the reflection termination, and (iii) calculate a position of the magnet along the magnetostrictive wire based on the detected electrical pulse generated by the torsional excitation signal after the torsional excitation signal was reflected by the reflection termination and without using any electrical pulse generated by torsional motion that propagated directly from the magnet to the first end of the wire.

16. The system of claim 15, further comprising:
a return wire coupled to the second end of the magnetostrictive wire.

17. The system of claim 15, further comprising:
a damping termination coupled to the first end of the magnetostrictive wire, the damping termination configured to substantially prevent any reflection of the torsional excitation signal of the magnetostrictive wire.

18. The system of claim 15, wherein the processor identifies whether electrical pulse detected by the electrical sensor was generated by the torsional excitation signal after the torsional excitation signal was reflected by the reflection termination based on a time duration between the application of the torsional excitation signal to the magnetostrictive wire and the detection of the electrical pulse by the electrical sensor.

19. The system of claim 18, wherein the time duration is greater than a length of time required for the torsional excitation signal to traverse an entire length of the magnetostrictive wire, and less than twice the length of time required for the torsional excitation signal to traverse the entire length of the magnetostrictive wire.

20. The system of claim 15, wherein the processor identifies whether electrical pulse detected by the electrical sensor was generated by the torsional excitation signal after the torsional excitation signal was reflected by the reflection termination based on a number of electrical pulses detected by the electrical sensor.

21. The system of claim 20, wherein the processor identifies whether electrical pulse detected by the electrical sensor was generated by the torsional excitation signal after the torsional excitation signal was reflected by the reflection termination if the electrical pulse is a second electrical pulse detected by the electrical sensor following the application of the torsional excitation signal.

22. The system of claim 15, wherein the processor identifies whether electrical pulse detected by the electrical sensor was generated by the torsional excitation signal after the torsional excitation signal was reflected by the reflection termination based on a polarity of the electrical pulse.

23. A method for magnetostrictive sensing comprising:
applying a torsional excitation signal to a magnetostrictive wire with an excitation device positioned adjacent a first end of the magnetostrictive wire;
detecting an electrical pulse propagating along the magnetostrictive wire with an electrical sensor electrically coupled to the first end of the magnetostrictive wire;

identifying whether the electrical pulse detected by the electrical sensor was generated by the torsional excitation signal after the torsional excitation signal was reflected by a reflection termination coupled to a second end of the magnetostrictive wire; and calculating a position of a magnet along the magnetostrictive wire based on the detected electrical pulse generated by the torsional excitation signal after the torsional excitation signal was reflected by the reflection termination and without using any electrical pulse generated by torsional motion that propagated directly from the magnet to the first end of the wire.

24. The method of claim 23, wherein the identification step is based on a time duration between the applying step and the detecting step.

25. The method of claim 24, wherein the time duration is greater than a length of time required for the torsional excitation signal to traverse an entire length of the magnetostrictive wire, and less than twice the length of time required for the torsional excitation signal to traverse the entire length of the magnetostrictive wire.

26. The method of claim 23, wherein the identification step is based on a number of electrical pulses detected by the electrical sensor.

27. The method of claim 26, wherein the identifying step comprises identifying a second electrical pulse detected by the electrical sensor as being the electrical pulse that was generated by the torsional excitation signal after the torsional excitation signal was reflected by a reflection termination.

28. The method of 23, wherein the identification step is based on a polarity of the electrical pulse detected by the electrical sensor.

* * * * *